(12) United States Patent
Corsi et al.

(10) Patent No.: US 6,958,723 B1
(45) Date of Patent: Oct. 25, 2005

(54) METHOD AND APPARATUS FOR REDUCING NOISE IN ANALOG-TO-DIGITAL CONVERTER DEVICES

(75) Inventors: Marco Corsi, Parker, TX (US); William J. Bright, Dallas, TX (US); Martin Kithinji Kinyua, Dallas, TX (US); William David Smith, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/803,128

(22) Filed: Mar. 17, 2004

(51) Int. Cl.[7] .............................................. H03M 1/38
(52) U.S. Cl. ..................................... 341/161; 341/143
(58) Field of Search ........................ 341/161, 118, 120, 341/143, 144, 145, 150

(56) References Cited

U.S. PATENT DOCUMENTS 6,456,573 B1 * 9/2002 Ueki et al. ................ 369/47.17

OTHER PUBLICATIONS

Analog Devices Product Specification Document: 14-Bit, 80/105 MSPS A/D Converter AD6645; REV. B, Copyright 2003, Analog Devices, Inc.

* cited by examiner

Primary Examiner—Peguy Jeanpierre
Assistant Examiner—Joseph Lauture
(74) Attorney, Agent, or Firm—W. Daniel Swayze, Jr.; W. James Brady; Frederick J. Telecky, Jr.

(57) ABSTRACT

An analog-to-digital converter apparatus has a plurality of stages. Each stage includes a residue amplifier having a first and second amplifier unit. Each of the amplifier units has a first input locus, a second input locus and an output locus. The amplifier units cooperate in receiving a differential input data signal at the first input loci. A DC level setting signal unit is coupled with the second input loci and provides a DC level setting current in a first current direction. A counter-current signal generating unit is coupled with the second input loci via a single coupling locus common with the second input loci and provides a control current signal to the second input loci in a second current direction opposite to the first current direction. The control current signal provides a DC level control for each of the amplifier units.

12 Claims, 2 Drawing Sheets

10

110

METHOD AND APPARATUS FOR REDUCING NOISE IN ANALOG-TO-DIGITAL CONVERTER DEVICES

BACKGROUND OF THE INVENTION

The present invention is directed to analog-to-digital converter apparatuses, and especially to current mode pipeline analog-to-digital converter apparatuses that include residue amplifiers in a plurality of stages.

A current mode pipeline analog-to-digital converter (ADC) usually employs a plurality of stages, each stage including a residue amplifier operating in cooperation with a track-and-hold device. In its preferred embodiment, the residue amplifier receives a differential analog signal at two amplifier units. A DC (direct current) level setting current signal is also provided to the two amplifier units to set the DC levels, and ultimately to set the common mode voltage for the two amplifier units. A preferred source for such DC level setting current signals is an NPN digital-to-analog converter (DAC). When an NPN DAC is used to provide DC level setting currents in a current mode pipeline ADC, it has been found useful to employ a PNP DAC to provide a control current signal to the two amplifier units to recentralize the common mode voltage of the output of the residue amplifier.

In configurations employing both a PNP DAC and an NPN DAC, both DAC devices are first order noise sources contributing noise that can be manifested in the output of a residue amplifier.

Noise is always a concern for designers of electronic devices, including ADC devices. It is desirable that noise in the output of the residue amplifier devices in an ADC apparatus be minimized in so far as can be achieved while retaining other advantageous operational characteristics.

SUMMARY OF THE INVENTION

An analog-to-digital converter apparatus has a plurality of stages. Each stage includes a residue amplifier having a first and second amplifier unit. Each of the amplifier units has a first input locus, a second input locus and an output locus. The amplifier units cooperate in receiving a differential input data signal at the first input loci. A DC level setting signal unit is coupled with the second input loci and provides a DC level setting current in a first current direction. A countercurrent signal generating unit is coupled with the second input loci via a single coupling locus common with the second input loci and provides a control current signal to the second input loci in a second current direction opposite to the first current direction. The control current signal provides a DC level control for each of the amplifier units.

It is, therefore, an object of the present invention to reduce noise in the output of a residue amplifier device in an ADC apparatus.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
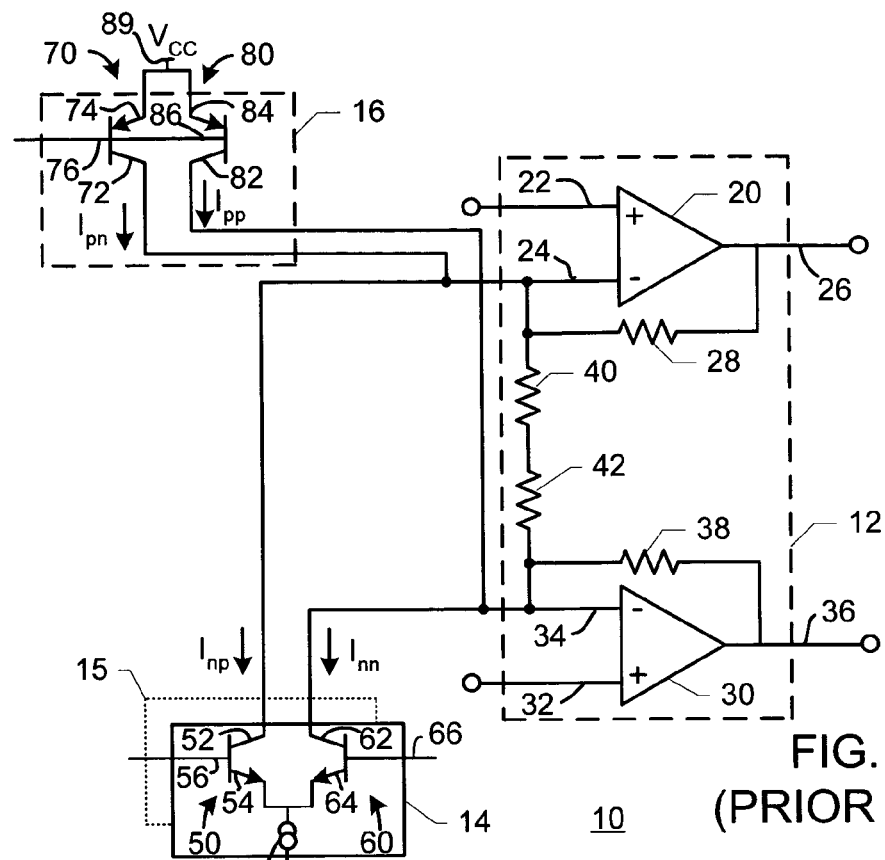
FIG. 1 is an electrical schematic diagram illustrating a prior art analog-to-digital converter apparatus.

FIG. 1 is an electrical schematic diagram illustrating a prior art analog-to-digital converter apparatus. In FIG. 1, an analog-to-digital converter (ADC) apparatus stage 10 includes a residue amplifier 12, an NPN digital-to-analog converter (DAC) 14 and a PNP DAC 16. NPN DAC 14 is embodied in a plurality of NPN DACs (indicated by dotted line 15); there are preferably $2^n$ NPN DACs 14 for each n bits handled by an analog-to-digital apparatus (not shown in FIG. 1) incorporating ADC apparatus stage 10.

Residue amplifier 12 includes a first amplifier unit 20 having a first input locus 22, a second input locus 24 and an output locus 26. A feedback network including a resistor 28 connects output locus 26 with second input locus 24. In the embodiment of ADC apparatus stage 10 illustrated in FIG. 1, first input locus 22 is a non-inverting input locus and second input locus 24 is an inverting input locus. Residue amplifier 12 also includes a second amplifier unit 30 having a first input locus 32, a second input locus 34 and an output locus 36. A feedback network including a resistor 38 connects output locus 36 with second input locus 34. In the embodiment of ADC apparatus stage 10 illustrated in FIG. 1, first input locus 32 is a non-inverting input locus and second input locus 34 is an inverting input locus. Second input loci 24, 34 are connected by an additional network including resistors 40, 42 coupled in series.

NPN DAC 14 includes a first NPN bipolar transistor 50 having a collector 52, an emitter 54 and a base 56. NPN DAC 14 also includes a second NPN bipolar transistor 60 having a collector 62, an emitter 64 and a base 66. A current source 58 is coupled between emitters 54, 64 and ground 69. Collector 52 is coupled with second input locus 24 of first amplifier unit 20 and base 56 is at a potential (not shown in detail in FIG. 1) to effect cooperation between transistor 50 and current source 58 to apply a current $I_{np}$ to second input locus 24. Collector 62 is coupled with second input locus 34 of second amplifier unit 30 and base 66 is at a potential (not shown in detail in FIG. 1) to effect cooperation between transistor 60 and current source 58 to apply current $I_{nn}$ to second input locus 34. Bases 56, 66 (and associated bases in additional NPN DACs; not shown in FIG. 1) receive digital control signals that are determined by input levels in previous stages of an analog-to-digital apparatus (not shown in FIG. 1) incorporating ADC apparatus stage 10.

PNP DAC 16 includes a first bipolar PNP transistor 70 having a collector 72, an emitter 74 and a base 76. NPN DAC 14 also includes a second PNP bipolar transistor 80 having a collector 82, an emitter 84 and a base 86. Emitters 74, 84 are coupled with a voltage supply locus 89 for receiving a supply voltage $V_{CC}$. Collector 72 is coupled with second input locus 24 of first amplifier unit 20 and base 76 is at a potential (not shown in detail in FIG. 1) to effect cooperation between transistor 70 and supply voltage $V_{CC}$ to apply a current $I_{pn}$ to second input locus 24. Collector 82 is coupled with second input locus 34 of second amplifier unit 30 and base 86 is at a potential (not shown in detail in FIG. 1) to effect cooperation between transistor 80 and supply voltage $V_{CC}$ to apply current $I_{pp}$ to second input locus 34.

Currents $I_{nn}$, $I_{np}$ participate in establishing a DC (direct current) level for operation of residue amplifier 12. Signals presented at output loci 26, 36 substantially represent said input data signals received at input loci 22, 32 less the DC level established by signals appearing at second input loci 24, 34. The other participants in establishing DC current level for operation of residue amplifier 12 are currents $I_{pn}$, $I_{pp}$ from PNP DAC 16. Currents $I_{pn}$, $I_{pp}$ are provided to recentralize common mode voltage for output signals appearing at output loci 26, 36.

NPN DAC 14 and PNP DAC 16 are each first order noise sources. Each of currents $I_{pn}$, $I_{pp}$, $I_{nn}$, $I_{np}$ contributes noise to residue amplifier 12. Current $I_{pn}$ contributes a noise current $I_{pn(noise)}$. Current $I_{pp}$ contributes a noise current $I_{pp(noise)}$. Current $I_{nn}$ contributes a noise current $I_{nn(noise)}$. Current $I_{np}$ contributes a noise current $I_{np(noise)}$. Thus, noise N is contributed to input loci 24, 34 by both NPN DAC 14 and PNP DAC 16, and noise appearing at output loci 26, 36 is related to noise currents $I_{pn(noise)}$, $I_{pp(noise)}$, $I_{nn(noise)}$, $I_{np(noise)}$:

$$N \sim \sqrt{I_{pn(noise)}^2 + I_{pp(noise)}^2 + I_{nn(noise)}^2 + I_{np(noise)}^2} \quad [1]$$

Where, $\sim$ indicates "related to".

Among other things, noise is a source of distortion in a circuit, and its removal is desirable so long as operation of the circuit is not degraded. The present invention removes the noise contributed to input loci 24, 34 by PNP DAC 16 by providing a single current source connected to a single coupling locus for both amplifier units 20, 30. Preferably, the coupling locus is situated between resistors 40, 42.

Figure 2:
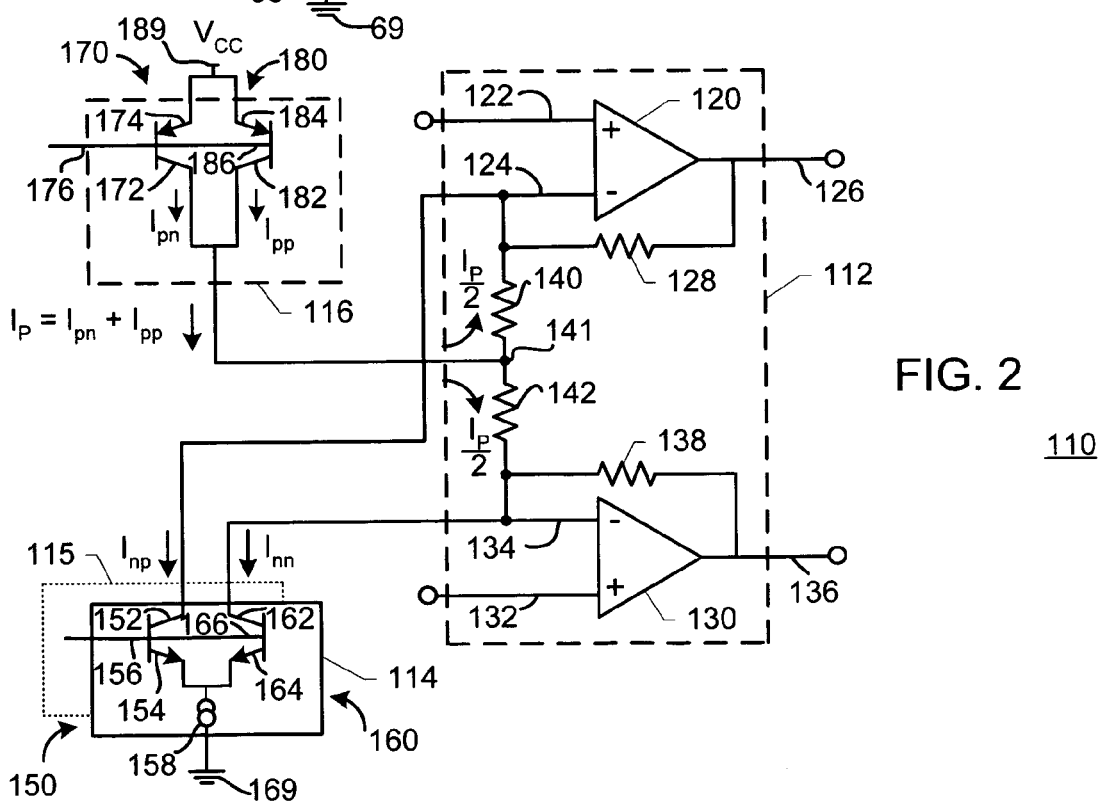
FIG. 2 is an electrical schematic diagram illustrating an analog-to-digital converter apparatus configured according to the present invention.

FIG. 2 is an electrical schematic diagram illustrating an analog-to-digital converter apparatus configured according to the present invention. In FIG. 2, an analog-to-digital converter (ADC) apparatus stage 110 includes a residue amplifier 112, an NPN digital-to-analog converter (DAC) 114 and a PNP DAC 116. NPN DAC 114 is embodied in a plurality of NPN DACs (indicated by dotted line 115); there are preferably $2^n$ NPN DACs 114 for each n bits handled by an analog-to-digital apparatus (not shown in FIG. 2) incorporating ADC apparatus stage 110.

Residue amplifier 112 includes a first amplifier unit 120 having a first input locus 122, a second input locus 124 and an output locus 126. A feedback network including a resistor 128 connects output locus 126 with second input locus 124. In the embodiment of ADC apparatus stage 110 illustrated in FIG. 2, first input locus 122 is a non-inverting input locus and second input locus 124 is an inverting input locus. Residue amplifier 112 also includes a second amplifier unit 130 having a first input locus 132, a second input locus 134 and an output locus 136. A feedback network including a resistor 138 connects output locus 136 with second input locus 134. In the embodiment of ADC apparatus stage 110 illustrated in FIG. 2, first input locus 132 is a non-inverting input locus and second input locus 134 is an inverting input locus. Second input loci 124, 134 are connected by an additional network including resistors 140, 142 coupled in series.

NPN DAC 114 includes a first NPN bipolar transistor 150 having a collector 152, an emitter 154 and a base 156. NPN DAC 114 also includes a second NPN bipolar transistor 160 having a collector 162, an emitter 164 and a base 166. A current source 158 is coupled between emitters 154, 164 and ground 169. Collector 152 is coupled with second input locus 124 of first amplifier unit 120 and base 156 is at a potential (not shown in detail in FIG. 2) to effect cooperation between transistor 150 and current source 158 to apply a current $I_{np}$ to second input locus 124. Collector 162 is coupled with second input locus 134 of second amplifier unit 130 and base 166 is at a potential (not shown in detail in FIG. 2) to effect cooperation between transistor 160 and current source 158 to apply current $I_{nn}$ to second input locus 134. Bases 156, 166 (and associated bases in additional NPN DACs; not shown in FIG. 2) receive digital control signals that are determined by input levels in previous stages of an analog-to-digital apparatus (not shown in FIG. 2) incorporating ADC apparatus stage 110.

PNP DAC 116 includes a first bipolar PNP transistor 170 having a collector 172, an emitter 174 and a base 176. NPN DAC 114 also includes a second PNP bipolar transistor 180 having a collector 182, an emitter 184 and a base 186. Emitters 174, 184 are coupled with a voltage supply locus 189 for receiving a supply voltage $V_{CC}$. Collectors 172, 182 are coupled with a coupling locus 141. Base 176 is at a potential (not shown in detail in FIG. 2) to effect cooperation between transistor 170 and supply voltage $V_{CC}$ to apply a current $I_{pn}$ to coupling locus 141. Base 186 is at a potential (not shown in detail in FIG. 2) to effect cooperation between transistor 180 and supply voltage $V_{CC}$ to apply a current $I_{pp}$ to coupling locus 141. Thus, PNP DAC 116 provides a total current $I_P$ that is equal to $(I_{pn}+I_{pp})$ to coupling locus 141. Current $$\frac{I_P}{2}$$

is thereby applied to input locus 124 (via resistor 140), and current $$\frac{I_P}{2}$$

is thereby applied to input locus 134 (via resistor 142). Resistors 140, 142 are substantially equal in value. Currents $I_{pp}$, $I_{pn}$ flow in an opposing direction to current flow of currents $I_{np}$, $I_{nn}$ that are applied to input loci 124, 134 from collectors 152, 162.

Currents $I_{nn}$, $I_{np}$ participate in establishing a DC (direct current) level for operation of residue amplifier 112. Signals presented at output loci 126, 136 substantially represent said input data signals received at input loci 122, 132 less the DC level established by signals appearing at second input loci 124, 134. The other participants in establishing DC current level for operation of residue amplifier 112 are currents $I_{pn}$, $I_{pp}$ (provided as current $I_p$) from PNP DAC 116. Currents $I_{pn}$, $I_{pp}$ are provided to recentralize common mode voltage for output signals appearing at output loci 126, 136. By applying currents $I_{pn}$, $I_{pp}$ to input loci 124, 134 from single coupling locus 141, currents $I_{pn}$, $I_{pp}$ do not contribute to noise at input loci 124, 134. The first order noise from PNP DAC 116 is eliminated from operation of residue amplifier 112 without degrading operation of residue amplifier 112.

Figure 3:
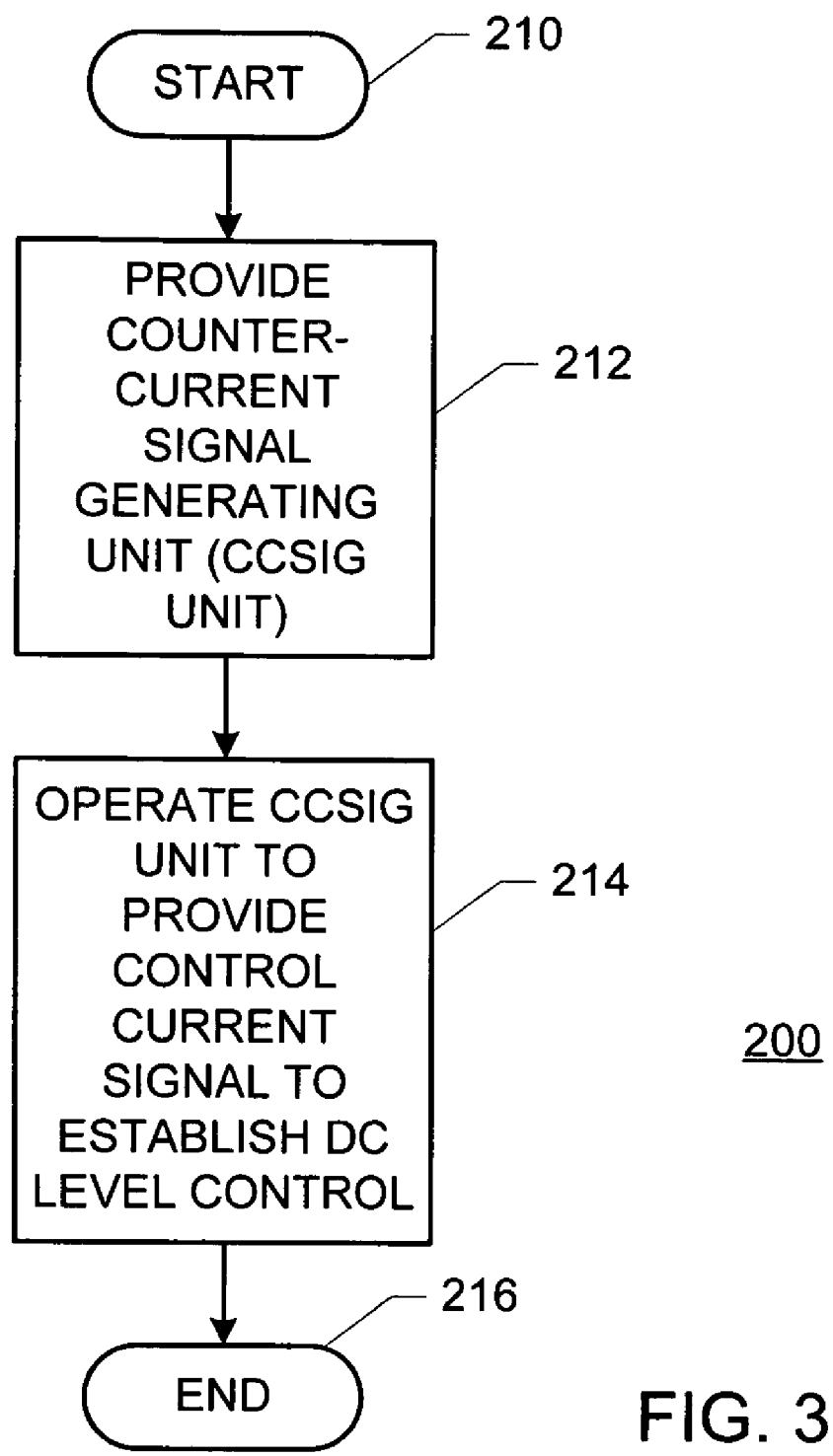
FIG. 3 is a flow diagram illustrating the method of the present invention.

FIG. 3 is a flow diagram illustrating the method of the present invention. In FIG. 3, a method 200 for reducing noise in input signals to a residue amplifier in an analog-to-digital converter apparatus begins at a START locus 210. The residue amplifier has a first amplifier unit and a second amplifier unit. Each of the first amplifier unit and the second amplifier unit has a first input locus, a second input locus and an output locus. The first and second amplifier units cooperate in receiving a differential input data signal at the first input loci of the first and second amplifier units. A DC level setting signal unit coupled with the second input loci of the first and second amplifier units provides a DC level setting current in a first current direction to the second input loci.

Method 200 continues with the step of providing a counter-current signal generating unit coupled with the second input loci via a single coupling locus common with the second input loci, as indicated by a block 212. Method 200 continues with the step of operating the counter-current signal generating unit to provide a control current signal to the second input loci in a second current direction opposite to the first current direction to establish a DC level control for each of the first and second amplifier units, as indicated by a block 214. Method 200 terminates at an END locus 216.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

We claim:

1. A current mode pipeline analog-to-digital converter apparatus including a plurality of stages; each respective stage of said plurality of stages comprising:
   (a) a respective residue amplifier including a first amplifying unit and a second amplifying unit; each of said first and second amplifying units having an inverting input locus, a non-inverting input locus and an output locus; each of said first and second amplifying units receiving a differential input data signal at one input locus of said inverting input locus and said non-inverting input locus; the other input loci of said first and second amplifying units other than said one input locus receiving a first current signal in a first current direction providing a DC level setting signal for each of said first and second amplifying units; signals presented at said output loci substantially representing said input data signal less said DC level setting signal; and
   (b) a counter-current signal generating unit coupled with said other input loci at a single coupling locus; said counter-current signal generating unit presenting a second current signal in a second current direction opposite to said first current direction providing a DC level control signal for each of said first and second amplifying units.

2. A current mode pipeline analog-to-digital converter apparatus including a plurality of stages as recited in claim 1 wherein said first current signal is provided by an NPN digital-to-analog converter unit.

3. A current mode pipeline analog-to-digital converter apparatus including a plurality of stages as recited in claim 2 wherein said counter-current signal generating unit is a PNP digital-to-analog converter unit.

4. A current mode pipeline analog-to-digital converter apparatus including a plurality of stages as recited in claim 1 wherein said counter-current signal generating unit is a PNP digital-to-analog converter unit.

5. An analog-to-digital converter apparatus having a plurality of stages; each respective stage of said plurality of stages comprising:
   (a) a residue amplifier having a first amplifier unit and a second amplifier unit; each of said first amplifier unit and said second amplifier unit having a first input locus, a second input locus and an output locus; said first and second amplifier units cooperating in receiving a differential input data signal at said first input loci of said first and second amplifier units;
   (b) a DC level setting signal unit coupled with said second input loci of said first and second amplifier units; said DC level setting signal unit providing a DC level setting current in a first current direction to said second input loci; and
   (c) a counter-current signal generating unit coupled with said second input loci via a single coupling locus common with said second input loci; said counter-current signal generating unit providing a control current signal to said second input loci in a second current direction opposite to said first current direction; said control current signal providing a DC level control for each of said first and second amplifier units.

6. An analog-to-digital converter apparatus having a plurality of stages as recited in claim 5 wherein said DC level setting current unit is an NPN digital-to-analog converter unit.

7. An analog-to-digital converter apparatus having a plurality of stages as recited in claim 6 wherein said counter-current signal generating unit is a PNP digital-to-analog converter unit.

8. An analog-to-digital converter apparatus having a plurality of stages as recited in claim 5 wherein said counter-current signal generating unit is a PNP digital-to-analog converter unit.

9. A method for reducing noise in input signals to a residue amplifier in an analog-to-digital converter apparatus; the residue amplifier having a first amplifier unit and a second amplifier unit; each of said first amplifier unit and said second amplifier unit having a first input locus, a second input locus and an output locus; said first and second amplifier units cooperating in receiving a differential input data signal at said first input loci of said first and second amplifier units; a DC level setting signal unit coupled with said second input loci of said first and second amplifier units provides a DC level setting current in a first current direction to said second input loci; the method comprising the steps of:
   (a) providing a counter-current signal generating unit coupled with said second input loci via a single coupling locus common with said second input loci; and
   (b) operating said countercurrent signal generating unit to provide a control current signal to said second input loci in a second current direction opposite to said first current direction to establish a DC level control for each of said first and second amplifier units.

10. A method for reducing noise in input signals to a residue amplifier in an analog-to-digital converter apparatus as recited in claim 9 wherein said DC level setting unit is an NPN digital-to-analog converter unit.

11. A method for reducing noise in input signals to a residue amplifier in an analog-to-digital converter apparatus as recited in claim 10 wherein said counter-current signal generating unit is a PNP digital-to-analog converter unit.

12. A method for reducing noise in input signals to a residue amplifier in an analog-to-digital converter apparatus as recited in claim 9 wherein said counter-current signal generating unit is a PNP digital-to-analog converter unit.

* * * * *